United States Patent
March et al.

(10) Patent No.: US 11,527,343 B2
(45) Date of Patent: Dec. 13, 2022

(54) METHOD FOR CHARGING A SUPERCONDUCTOR MAGNET SYSTEM, WITH A MAIN SUPERCONDUCTOR BULK MAGNET AND A SHIELD SUPERCONDUCTOR BULK MAGNET

(71) Applicant: Bruker Switzerland AG, Faellanden (CH)

(72) Inventors: Stephen Alfred March, Zurich (CH); Joerg Hinderer, Waldshut-Tiengen (DE); Stephan Heiss, Wiesendangen (CH)

(73) Assignee: BRUKER SWITZERLAND AG, Faellanden (CH)

( * ) Notice: Subject to any disclaimer, the term of this patent is extended or adjusted under 35 U.S.C. 154(b) by 300 days.

(21) Appl. No.: 17/085,314

(22) Filed: Oct. 30, 2020

(65) Prior Publication Data

US 2021/0151230 A1  May 20, 2021

(30) Foreign Application Priority Data

Nov. 14, 2019  (EP) ..................... 19209166

(51) Int. Cl.
*H01F 6/00* (2006.01)
*H01F 6/04* (2006.01)
(Continued)

(52) U.S. Cl.
CPC ............... *H01F 6/008* (2013.01); *H01F 6/04* (2013.01); *H01F 27/36* (2013.01);
(Continued)

(58) Field of Classification Search
CPC ... H01F 6/00; H01F 6/008; H01F 6/04; H01F 6/06; H01F 13/003; H01F 27/36; G01R 33/34023; G01R 33/3815; G01R 33/421
(Continued)

(56) References Cited

U.S. PATENT DOCUMENTS 7,222,490 B2    5/2007  Triebe et al.
7,859,374 B2 *  12/2010 Iwasa ................. G01R 33/3804
                                                       335/297

(Continued)

FOREIGN PATENT DOCUMENTS

DE    102015218019 A1   3/2017
EP       1655616 A1   10/2006
(Continued)

OTHER PUBLICATIONS

Machine translation of Fukutomi et al. Japanese Patent Document JP H09-74012 A Mar. 18, 1997 (Year: 1997).*
(Continued)

*Primary Examiner* — Kevin J Comber
(74) *Attorney, Agent, or Firm* — Edell, Shapiro & Finnan, LLC

(57) ABSTRACT

Charging method for a superconductor magnet system with reduced stray field, weight and space includes: arranging the system within a charger magnet bore; with $T_{main} > T_{main}^{crit}$ and $T_{shield} > T_{shield}^{crit}$, applying a current $I_{charger}$ to the charger magnet and increasing $I_{charger}$ to a first current $I_1 > 0$; lowering a main superconductor bulk magnet temperature $T_{main}$ to an operation temperature $T_{main}^{op}$, with $T_{main}^{op} < T_{main}^{crit}$, while keeping $T_{shield} > T_{shield}^{crit}$; lowering $I_{charger}$ to a second current $I_2 < 0$, thereby inducing a persistent current $IP_{main}$ in the main magnet; lowering a shield magnet temperature $T_{shield}$ to an operation temperature $T_{shield}^{op}$, with $T_{shield}^{op} < T_{shield}^{crit}$; increasing $I_{charger}$ to zero, thereby inducing a persistent current $IP_{shield}$ in the shield magnet; removing the magnet system from the charger bore, and keeping $T_{main} \leq T_{main}^{op}$ with $T_{main}^{op} < T_{main}^{crit}$ and $T_{shield} \leq T_{shield}^{op}$ with $T_{shield}^{op} < T_{shield}^{crit}$; where: $T_{main}^{crit}$: main magnet critical temperature and $T_{shield}^{crit}$: shield magnet critical temperature.

10 Claims, 4 Drawing Sheets

(51) Int. Cl.
*H01F 27/36* (2006.01)
*G01R 33/34* (2006.01)
*G01R 33/3815* (2006.01)
*H01F 6/06* (2006.01)

(52) U.S. Cl.
CPC .... *G01R 33/34023* (2013.01); *G01R 33/3815* (2013.01); *H01F 6/06* (2013.01)

(58) Field of Classification Search
USPC .......................................................... 361/141
See application file for complete search history.

(56) References Cited

U.S. PATENT DOCUMENTS

| | | | |
|---|---|---|---|
| 2006/0252650 A1 | 11/2006 | Oka et al. | |
| 2008/0246567 A1* | 10/2008 | Isogami | H01F 6/04 335/216 |
| 2017/0082707 A1* | 3/2017 | Wikus | G01R 33/3804 335/297 |
| 2019/0162802 A1 | 5/2019 | Morita | |
| 2020/0161039 A1 | 5/2020 | Hinderer et al. | |

FOREIGN PATENT DOCUMENTS

| | | | |
|---|---|---|---|
| EP | 19170280.2 | | 4/2019 |
| EP | 3492941 A1 | | 6/2019 |
| EP | 3493226 A | | 6/2019 |
| EP | 3657193 A1 | | 5/2020 |
| JP | 09074012 A | * | 3/1997 |
| JP | H0974012 A | | 3/1997 |
| JP | 2005123231 A | * | 5/2005 |
| JP | 2005123231 A | | 5/2005 |
| WO | 2016161336 A1 | | 10/2016 |

OTHER PUBLICATIONS

Machine translation of Hirose Japanese Patent Document JP 2005123231 A May 12, 2005 (Year: 2005).*

Douine et al., "Improvement of YBCO Superconductor Magnetic Shielding by Using Multiple Bulks" Journal of Superconductivity and Novel Magnetism, vol. 27, No. 4 (2013), pp. 903-907 5 pages.

Giunchi, "The MgB2 bulk cylinders as magnetic shields for physical instrumentation", 20th IMEKO TC4 International Symposium and 18th International Workshop on ADC Modeling and Testing Research on Electric and Electronic Measurement for the Economic Upturn, Beneventro, Italy, (Sep. 15-17, 2014), 5 pages.

Nakamura et al., "Development of a superconducting bulk magnet for NMR and MRI", Journal of Magnetic Resonance 259 (2015), pp. 68-75.

Brochure "Superconducting Magnetic Shields CST/CSV (tubes/vessels)" 1 page.

Durrell et al.: "Bulk superconductors: A roadmap to applications" Superconductor Science and Technology, (2018), 17 pages.

Search Report for European counterpart application EP19209166, dated Jan. 13, 2020, 3 pages.

* cited by examiner

METHOD FOR CHARGING A SUPERCONDUCTOR MAGNET SYSTEM, WITH A MAIN SUPERCONDUCTOR BULK MAGNET AND A SHIELD SUPERCONDUCTOR BULK MAGNET

CROSS REFERENCE TO RELATED APPLICATIONS

This application claims foreign priority under 35 U.S.C. § 119(a)-(d) to European Patent Application EP 19 209 166.8 filed on Nov. 14, 2019, and the contents of which are incorporated into the present application by reference in their entirety.

FIELD OF THE INVENTION

The invention relates to a method for charging a superconductor magnet system, the superconductor magnet system comprising a main superconductor bulk magnet. The invention relates also to a superconductor magnet system.

BACKGROUND

Such a method, based on the so called "field cooling" process, is described in U.S. Pat. No. 7,859,374 B2, which is considered the nearest state of the art.

Superconductors carry an electric current at practically no ohmic losses. The superconducting state of a superconductor is assumed only below a critical temperature $T_{crit}$, which is in the cryogenic range, and depends on the superconductor material used.

Superconductors can be used to generate strong magnetic fields (or magnetic flux densities). The magnetic field is generated by an electric current running within the superconductor, typically wherein the superconductor forms a coil or ring for this purpose ("superconductor magnet"), and the magnetic field is obtained in a superconductor bore. In particular, the electric current can run in a closed superconducting electric circuit at a practically constant current strength, without a need for a connection to an electric current source once charged ("persistent mode").

Coil type superconductor magnet apparatus are typically charged with a directly connected electric current source, and when the charging is complete, a superconducting switch is closed to establish the persistent mode.

For superconductor bulk magnets, which are based on closed ring-shaped superconducting structures, no electric contacts are necessary. Superconductor bulk magnets may be charged by a procedure known as "field cooling", e.g. described in U.S. Pat. No. 7,859,374 B2. In this procedure, the superconductor bulk magnet located within a cryostat is placed in an electrical charger magnet. Initially, the temperature of the superconductor bulk magnet is kept above $T_{crit}$, and the electrical charger magnet is ramped up until a desired magnetic field has been reached. Then the temperature within the cryostat is lowered below $T_{crit}$, so that the superconductor bulk magnet becomes superconducting. Then the electrical charger magnet is ramped down. During this, superconducting electric currents are induced within the superconductor bulk magnet, opposing the change of magnetic flux, and as a result trapping (or conserving) the magnetic flux within a superconductor bore of the superconductor bulk magnet. Then the superconductor bulk magnet together with its cryostat may be removed from the electrical charger magnet. As long as the superconductor bulk magnet is kept sufficiently cold, and in particular below $T_{crit}$, the magnetic field within the superconductor bore stays constant and can be used, for example for NMR measurements. For accessing the trapped magnetic field in an experiment, such as an NMR experiment, the cryostat should provide a room temperature bore, which in turn is arranged within the superconductor bore.

T. Nakamura et al., Journal of Magnetic Resonance 259 (2015), page 68-75, also describes a superconductor magnetic system with a superconductor bulk magnet for use in NMR.

However, the superconductor bulk magnet not only generates (or conserves) a magnetic field in its superconductor bore, but also generates a magnetic field on its outside ("stray field"). This outside stray field is in general not desired, since it may disturb electrical equipment nearby, and even may be dangerous to persons carrying for example a pacemaker.

In order to reduce the stray field, it is known to surround the superconductor bulk magnet with ferromagnetic material.

U.S. Pat. No. 7,859,374 B2 proposes to place a shielding of steel sheets around the cryostat containing a superconductor bulk magnet after the electrical charger has been removed. The steel sheets will reduce the stray field in the vicinity of the superconductor bulk magnet. However, the ferromagnetic material necessary for shielding is heavy and takes a lot of space, what is particularly disadvantageous for benchtop size magnet systems.

Post-published European patent application 19 170 280.2 also describes a superconductor bulk magnet equipped with ferromagnetic shields.

The Czech company "CAN superconductors", Kamenice, C Z, offers Bi-2223 based bulk tubes as superconductor magnetic shields, compare the company brochure (datasheet) "SUPERCONDUCTING MAGNETIC SHIELDS CST/CSV", downloaded on Oct. 7, 2019 at https://www.can-superconductors.com/magnetic-shield-s.html. The bulk tubes may be used to keep external magnetic fields from reaching the inside of the bulk tubes.

For superconductor magnet systems based on solenoid type magnet coils, it is known to apply an electric current of a first polarity to the radially inner coil sections, and to apply an electric current of opposite polarity to a radially outward coil section in order to reduce the stray field, compare e.g. DE 10 2015 218 019 A1.

In EP 3 492 941 A1 a magnetization method for a bulk magnetic structure is described, wherein after a basic magnetization step, the bulk magnetic structure is further magnetized by controlling at least one of a temperature controller or a magnetic field generator, for obtaining a more uniform magnetic field distribution.

US 2006/0252650 A1 describes a superconducting permanent magnet comprising a plurality of bulk superconductors arranged in parallel.

SUMMARY

It is an object of the invention to reduce stray fields of superconductor magnet systems based on a superconductor bulk magnet, wherein less weight and space are required for shielding purposes.

SHORT DESCRIPTION OF THE INVENTION

This object is achieved, in accordance with one formulation of the invention, by a method for charging a superconductor magnet system, the superconductor magnet system comprising a main superconductor bulk magnet,
a shield superconductor bulk magnet, and
a cryostat system having a room temperature bore,
with the cryostat system containing the main superconductor bulk magnet and the shield superconductor bulk magnet,
with the shield superconductor bulk magnet radially surrounding the main superconductor bulk magnet,
and with the main superconductor bulk magnet and the shield superconductor bulk magnet being arranged coaxially with the room temperature bore,
the method comprising the following steps:

step a) arranging the superconductor magnet system at least partially within a charger bore of a charger magnet, in particular with the charger bore being arranged coaxially with the room temperature bore of the cryostat system;

step b) with $T_{main} > T_{main}^{crit}$ and $T_{shield} > T_{shield}^{crit}$, applying an electrical current $I_{charger}$ to the charger magnet and increasing $I_{charger}$ to a first current $I_1 > 0$, step c) lowering $T_{main}$ to or below an operation temperature $T_{main}^{op}$ of the main superconductor bulk magnet, with $T_{main}^{op} < T_{main}^{crit}$, while keeping $T_{shield} > T_{shield}^{crit}$;

step d) lowering $I_{charger}$ to a second current $I_2 < 0$, wherein a main persistent current $IP_{main}$ is induced in the main superconductor bulk magnet which stays below a critical current of the main superconductor bulk magnet at $T_{main}$, with $T_{main} \leq T_{main}^{op}$;

step e) lowering $T_{shield}$ to or below an operation temperature $T_{shield}^{op}$ of the shield superconductor bulk magnet, with $T_{shield}^{op} < T_{shield}^{crit}$;

step f) increasing $I_{charger}$ to zero, wherein a shield persistent current $IP_{shield}$ is induced in the shield superconductor bulk magnet which stays below a critical current of the shield superconductor bulk magnet at $T_{shield}$, with $T_{shield} \leq T_{shield}^{op}$;

step g) removing the superconductor magnet system from the charger bore of the charger magnet, and keeping $T_{main}$ at or below $T_{main}^{op}$ with $T_{main}^{op} < T_{main}^{crit}$ as well as $T_{shield}$ at or below $T_{shield}^{op}$ with $T_{shield}^{op} < T_{shield}^{crit}$;

with $T_{main}$: temperature of the main superconductor bulk magnet;

$T_{main}^{crit}$: critical temperature of the main superconductor bulk magnet;

$T_{shield}$: temperature of the shield superconductor bulk magnet; and $T_{shield}^{crit}$: critical temperature of the shield superconductor bulk magnet.

The inventive procedure achieves the charging of both the radially inner main superconductor bulk magnet with a main persistent current, and the radially outer shield superconductor bulk magnet with a shield persistent current. Through the inventive procedure, the main persistent current and the shield persistent current have opposite current directions ("opposite polarity"), so in the surroundings of the superconductor magnet system, their corresponding magnetic fields (or magnetic flux densities) are opposed to each other and therefore cancel out each other, at least partially, and preferably practically completely. Accordingly, the stray field is reduced by an active shielding.

The main persistent current of the main superconductor bulk magnet results from a take-over of magnetic flux from the charger magnet when the charger current $I_{charger}$ is reduced from the first current $I_1$ (which is >0) to the second current $I_2$ (which is <0). Here, only the main superconductor bulk magnet is superconducting, and traps the magnetic flux in its interior.

In contrast, the shield persistent current of the shield superconductor bulk magnet results from a take-over of magnetic flux from the charger magnet when the charger current $I_{charger}$ is increased from the second current $I_2$ (which is <0) to zero current ($I_{charger}=0$). Then, also the shield superconductor bulk magnet is superconducting, in order to trap magnetic flux in its interior; here the magnetic flux inside the main superconductor bulk magnet does not change anymore.

In order to charge the main superconductor bulk magnet and the shield superconductor bulk magnet independently, the inventive method provides that the conductivity states (normally conducting or superconducting) are chosen temporarily different for the main superconductor bulk magnet and the shield superconductor bulk magnet during the charging procedure. For this purpose, their temperatures $T_{main}$, $T_{shield}$ are set to different values during some of the steps, in particular steps c) and d). Accordingly, the main superconductor bulk magnet and the shield superconductor bulk magnet are, at least temporarily, substantially thermally decoupled during the inventive method.

As long as a (main or shield) superconductor bulk magnet is above its critical temperature, any induced electric currents will decay quickly, and the respective superconductor bulk magnet is "transparent" during the charging procedure.

In contrast, when a (main or shield) superconductor bulk magnet is below its critical temperature, it will conserve any induced electric currents, and thus trap the magnetic flux in its interior (inside its superconductor bore). Note that the induced (persistent) current stays, in accordance with the invention, below the critical current at the respective operation temperature then, i.e. it does not reach the critical current, so the trapping of the magnetic flux may be accomplished completely. For this purpose, the operation temperature should be chosen sufficiently far below the respective critical temperature.

The inventive method does not require heavy and bulky ferromagnetic shielding plates, but instead may accomplish the shielding with a relatively small shield superconductor bulk magnet. As compared to ferromagnetic shielding material such as iron, the active shielding using the shield superconductor bulk magnet in accordance with the invention is much more efficient per weight.

Typically the shield superconductor bulk magnet is placed in the same vacuum container of the cryostat system as the main superconductor bulk magnet, but with some distance to it for thermal decoupling. However, it is also possible to have different vacuum containers for the main and the shield superconductor bulk magnets.

It should be noted that in the charged state, both the main superconductor bulk magnet and the shield superconductor bulk magnet contribute to the magnetic field at the sample volume near the magnetic center in the room temperature bore, and therefore both contribute to the homogeneity of the magnetic field there, too. Preferably, the geometry of the shield superconductor bulk magnet is adapted as to improve the homogeneity of the magnetic field that would result from the main superconductor bulk magnet alone. More specifically, the shield superconductor bulk magnet may be used to cancel out leading terms of axial gradients (even orders like Z2 or Z4) in the total magnetic field. The shield superconductor bulk magnet typically projects beyond the main superconductor bulk magnet in axial direction, typically by at least 1/10, preferably at least 1/5, of its average radius $R_{shield}$. Further, typically for the average radius $R_{shield}$ of the shield superconductor bulk magnet and the average radius $R_{main}$ of the main superconductor bulk magnet, $R_{shield} \geq 1.5 * R_{main}$ applies.

The main superconductor bulk magnet and the shield superconductor bulk magnet are in general made from a high temperature superconductor material, for example of ReBCO type (Re: rare earth element, in particular Y or Gd) or BSCCO type or of $MgB_2$ type or of pnictide type (compare WO 2016/161336 A1), with $T_{main}^{crit} > 30$ K and $T_{shield}^{crit} > 30$K. The main and shield superconductor bulk magnets are substantially of cylindrical shape and have a central (axial) bore. They are generally of closed ring shape, to allow a (main or shield) persistent circular electrical current causing a magnetic field substantially along the axis of the central bore. They may comprise a multitude of axial layers and/or radial layers, and may in particular be made of a multitude of stacked ring elements and/or may comprise a circumferential superconductor coating on a tube type carrier body or bodies.

PREFERRED VARIANTS OF THE INVENTION

In a preferred variant of the inventive method, $|I_2/I_1| \leq 0.33$, preferably $|I_2/I_1| \leq 0.25$. Such ratios of the first and second current result, for typical sizes of main and shield superconductor bores, in a high degree of stray field reduction.

Particularly preferred is a variant wherein $0.7 \leq |I_1/I_2|*|R_{main}^2/R_{shield}^2| \leq 1.4$,
preferably $0.8 \leq |I_1/I_2|*|R_{main}^2/R_{shield}^2| \leq 1.25$,
with $R_{main}$: average radius of the main superconductor bulk magnet; and
$R_{shield}$: average radius of the shield superconductor bulk magnet. Preferably, $|I_1/I_2|*|R_{main}^2/R_{shield}^2| = 1$. With such ratios, an excellent degree of stray field reduction can be achieved; in general, the radius of a 5 G contour may be reduced to ¼ or even less as compared to an unshielded situation. For determining $R_{main}$ and $R_{shield}$, averaging is done across the respective superconductor bulk material over the circumferential direction and over the axial direction. For a simple circular tube type design, an average radius represents the middle between the inner radius and outer radius. Typically, $R_{shield} > 1.5*R_{main}$ or $R_{shield} \geq 2*R_{main}$.

Particularly preferred is a variant wherein $T_{main}^{op} \leq 0.75*T_{main}^{crit}$ and $T_{shield}^{op} \leq 0.75*T_{shield}^{crit}$, preferably $T_{main}^{op} \leq 0.60*T_{main}^{crit}$ and $T_{shield}^{op} \leq 0.60*T_{shield}^{crit}$. With these operation temperatures $T_{main}^{op}$ and $T_{shield}^{op}$, the main and shield persistent current typically stay well below the critical current at the respective operation temperature. Note that the temperatures are noted in Kelvin here.

Variant with a Single Normal Cryocooler

An advantageous variant provides
that the cryostat system comprises a normal cryocooler and thermal connections of the normal cryocooler to a main bulk thermal stage connected to the main superconductor bulk magnet and to a shield bulk thermal stage connected to the shield superconductor bulk stage,
that during step c) and step d), a shield thermal switch in the thermal connection to the shield bulk thermal stage is open, and
that during step e) and after step e), the shield thermal switch is kept closed. A "normal" cryocooler is designated for use (at least) in the steady state from step g) on. In this variant, independent temperature levels of the main and shield superconductor bulk magnet can be achieved with a single normal cryocooler. In particular, the shield thermal switch avoids a thermal short-circuit of the thermal stages during the cooling procedure. This design is relatively inexpensive, but requires a relatively large cooling power of the normal cryocooler if the normal cryocooler is intended as the only source of cooling power during the entire method.

Variants Using an Auxiliary Cryocooler and a Normal Cryocooler

A preferred variant provides
that at least during steps c) through f), the cryostat system is equipped with an auxiliary cryocooler,
that during steps c) through f), cooling power of the auxiliary cryocooler is directed to a main bulk thermal stage connected to the main superconductor bulk magnet,
that during steps e) and f), cooling power of the auxiliary cryocooler is directed to a shield bulk thermal stage connected to the shield superconductor bulk magnet,
that after step f), the auxiliary cryocooler is removed from the cryostat system,
and that the cryostat system comprises a normal cryocooler and thermal connections of the normal cryocooler to the main bulk thermal stage and to the shield bulk thermal stage,
and that after step f), the normal cryocooler provides cooling power to the main bulk thermal stage and the shield bulk thermal stage. In this variant, the cooling power of the normal cryocooler can be chosen relatively small, enough so during the steady state from step g) on, it is capable of keeping the main and shield superconductor bulk magnets at their respective operation temperatures; note that the normal cryocooler is in general permanently installed at the cryostat system. During the charging procedure, when the thermal stages have to be cooled down from temperatures above the respective critical temperatures, the cooling power of the auxiliary cryocooler can be used; since the auxiliary cryocooler is removed after charging (i.e. typically still on the premises of the manufacturer), its size does not influence the size of the superconductor magnet system in practical use at the site of application. A design for an auxiliary cryocooler that can be applied in the present invention is described in EP 1 655 616 A1, the entire content of which is hereby incorporated by reference.

In an advantageous further development of the above variant, the normal cryocooler provides cooling power to the main bulk thermal stage and the shield bulk thermal stage only after step f). Then malfunctions of the normal cryocooler, which may be caused by the stray field of the superconductor magnet system during charging (i.e. before the active shielding is in force), can be avoided. The normal cryocooler does not need to be operational in strong magnetic fields.

Another further development of the above variant provides that the thermal connection between the normal cryocooler and the main bulk thermal stage and/or the thermal connection between the normal cryocooler and the shield bulk thermal stage include a weak thermal link or a thermal switch,
and that the weak thermal link or the thermal switch slows down or blocks heat conduction between the normal cryocooler and the main bulk thermal stage and/or between the normal cryocooler and the shield bulk thermal stage during at least some of step c), step d), step e) and/or step f). The thermal switch(es) and weak link(s) avoid a thermal short-circuit of the main bulk thermal stage and the shield thermal stage via the normal cryocooler, and thus facilitate keeping the thermal stages (and thus the main and shield superconductor bulk magnet) temporarily at different temperatures in the course of the inventive method. The weak thermal link slows down heat conduction through the weak link to a degree such that this heat conduction is small (e.g. 20% or less) as compared to a heat conduction (cooling power input) between the auxiliary cryocooler and the thermal stage connected to said weak link.

Variant with Two Normal Cryocoolers

Another preferred variant provides that the cryostat system includes two normal cryocoolers, with a first of the normal cryocoolers having a thermal connection to a main bulk thermal stage connected to the main superconductor bulk magnet, and a second of the normal cryocoolers having a thermal connection to a shield bulk thermal stage connected to the shield superconductor bulk magnet, and that the first normal cryocooler provides cooling power to the main bulk thermal stage from step c) on and later, and wherein the second normal cryocooler provides cooling power to the shield bulk thermal stage form step e) on and later. This design is relatively simple. In order to reduce the required cooling power of the normal cryocooler connected to the main bulk thermal stage, a shield thermal switch may be integrated in the thermal connection of the second normal cryocooler connected to the shield bulk thermal stage.

Inventive Superconductor Magnet Systems

Within the scope of the present invention is further a superconductor magnet system comprising
a main superconductor bulk magnet,
a cryostat system having a room temperature bore,
and a cooling system adapted for cooling the main superconductor bulk magnet, with the cryostat system containing the main superconductor bulk magnet,
and with the main superconductor bulk magnet arranged coaxially with the room temperature bore,
characterized in
that the superconductor magnet system further comprises a shield superconductor bulk magnet, with the cryostat system also containing the shield superconductor bulk magnet,
with the shield superconductor bulk magnet radially surrounding the main superconductor bulk magnet,
and with the shield superconductor bulk magnet also being arranged coaxially with the room temperature bore,
and that the cooling system is further adapted for cooling the shield superconductor bulk magnet and for selectively maintaining the following states:
state a) $T_{main} > T_{main}^{crit}$ and at the same time $T_{shield} > T_{shield}^{crit}$, further
state b) $T_{main}$ is at or below an operation temperature $T_{main}^{op}$ of the main superconductor bulk magnet, with $T_{main}^{op} < T_{main}^{crit}$ and at the same time $T_{shield} > T_{shield}^{crit}$, and further
state c) $T_{main}$ is at or below the operation temperature $T_{main}^{op}$, with $T_{main}^{op} < T_{main}^{crit}$ and at the same time $T_{shield}$ is at or below an operation temperature $T_{shield}^{op}$ of the shield superconductor bulk magnet, with $T_{shield}^{op} < T_{shield}^{crit}$,
with $T_{main}$: temperature of the main superconductor bulk magnet;
$T_{main}^{crit}$: critical temperature of the main superconductor bulk magnet;
$T_{shield}$: temperature of the shield superconductor bulk magnet; and
$T_{shield}^{crit}$: critical temperature of the shield superconductor bulk magnet. With the inventive superconductor magnet system described above, the inventive charging method may be performed. State a) can be used during step b), further state b) can be used during step d), and state c) can be used during steps f) and g). The charger current $I_{charger}$ is typically controlled via an electronic control device, which preferably also monitors and controls the temperatures $T_{main}$ and $T_{shield}$ and automatically conducts the inventive charging procedure.

In a preferred embodiment of the inventive superconductor magnet system, the cooling system comprises a main bulk thermal stage connected to the main superconductor bulk magnet and a shield bulk thermal stage connected to the shield superconductor bulk magnet. The main bulk thermal stage and the shield bulk thermal stage are arranged at a distance from each other, in particular the main bulk thermal stage and the shield bulk thermal stage are arranged on opposite axial sides of the main superconductor bulk magnet and the shield superconductor bulk magnet. By using the thermal stages and arranging the thermal stages at a distance, setting (and in particular differently setting) the temperatures of the main and shield superconductor magnets is simplified. Arranging the main bulk thermal stage and the shield bulk thermal stage at opposing axial sides improves the thermal decoupling of the thermal stages.

In a preferred further development, the main bulk thermal stage and the shield bulk thermal stage comprise separate electrical heaters. The heaters allow a finer control of the temperatures of the thermal stages or the main and shield superconductor bulk magnets, and in particular if the respective cooling powers provided to the two thermal stages cannot be controlled independently, or can only coarsely be controlled, then the heaters may guarantee a temperature of the respective thermal stages above the respective critical temperature as required by the inventive method. Note that in another further development in accordance with the invention, only the shield bulk thermal stage comprises an electrical heater, but not the main bulk thermal stage.

In a preferred further development, the cooling system comprises a normal cryocooler and thermal connections of the normal cryocooler to the main bulk thermal stage and to the shield bulk thermal stage. The thermal stages facilitate setting the $T_{main}$ and $T_{shield}$ independently during charging. The normal cryocooler may provide cooling power at least in the steady state use from step g) on.

Advantageously in this further development a shield thermal switch is arranged in the thermal connection of the normal cryocooler to the shield bulk thermal stage. Then achieving different temperatures at the two thermal stages, in particular for step d), is facilitated. In particular, in a relatively simple design, a single normal cryocooler may provide cooling power both during charging and during steady state use. Note that alternatively to the thermal switch, also a weak thermal link can be arranged in the thermal connection of the normal cryocooler to the shield bulk thermal stage, e.g. reducing the cooling power input from the normal cryocooler to the shield bulk thermal stage to 20% or less as compared to the cooling power input through the thermal connection from the normal cryocooler to the main bulk thermal stage.

Another further development of the above described embodiment provides that the cooling system further comprises an auxiliary cryocooler,
wherein the auxiliary cryocooler is removably attached to the cryostat system,
and that the cooling system is adapted to provide cooling power of the auxiliary cryocooler independently to the main bulk thermal stage and the shield bulk thermal stage. Then the normal cryocooler, which is in general permanently installed in the cryostat system may have a relatively small cooling power, and the superconductor magnet system, in use, may be relatively compact. Further, the normal cryocooler does not need to be operated during the charging process when the active shielding is not yet in force.

Advantageously in this further development, the thermal connection between the normal cryocooler and the main bulk thermal stage and/or the thermal connection between the normal cryocooler and the shield bulk thermal stage include a weak thermal link or a thermal switch. This avoids a thermal short-circuit of the thermal stages via the normal cryocooler.

In an advantageous embodiment, the cooling system includes two normal cryocoolers, with a first of the normal cryocoolers having a thermal connection to the main bulk thermal stage, and a second of the normal cryocoolers having a thermal connection to the shield bulk thermal stage. This design is relatively simple. If desired, the thermal connection of the second of the normal cryocoolers to the shield bulk thermal stage may include a thermal switch.

Inventive Use of a Superconductor Magnet System

Further within the scope of the present invention is the use of a superconductor magnet system, the superconductor magnet system comprising a main superconductor bulk magnet, a cryostat system having a room temperature bore, and a cooling system adapted for cooling the main superconductor bulk magnet, with the cryostat system containing the main superconductor bulk magnet, and with the main superconductor bulk magnet arranged coaxially with the room temperature bore, characterized in that the superconductor magnet system further comprises a shield superconductor bulk magnet, with the cryostat system also containing the shield superconductor bulk magnet, with the shield superconductor bulk magnet radially surrounding the main superconductor bulk magnet, and with the shield superconductor bulk magnet also being arranged coaxially with the room temperature bore, that the cooling system is further adapted for cooling the shield superconductor bulk magnet, and that the shield superconductor bulk magnet carries a shield persistent current $IP_{shield}$ which has an opposite current direction as compared to a main persistent current $IP_{main}$ carried by the main superconductor bulk magnet. With the main persistent current and the shield persistent current having opposite current directions ("signs"), an active shielding of the stray field is achieved. This state of use can be achieved by applying an inventive charging method described above to the superconductor magnet system. Note that for typical superconductor magnet sizes, often $0.08 \leq |IP_{shield}/IP_{main}| \leq 0.33$ or $0.1 \leq |IP_{shield}/IP_{main}| \leq 0.25$ applies.

In a preferred variant of the above described use, $0.6 \leq |IP_{main}/IP_{shield}| * |R_{main}^2/R_{shield}^2| \leq 1.6$, preferably $0.7 \leq |IP_{main}/IP_{shield}| * |R_{main}^2/R_{shield}^2| \leq 1.4$, with $R_{main}$: average radius of the main superconductor bulk magnet; and $R_{shield}$: average radius of the shield superconductor bulk magnet. With these dimensions and persistent current values, a particularly good active shielding can be achieved. Preferably, $|IP_{main}/IP_{shield}| * |R_{main}^2/R_{shield}^2| = 1$.

Inventive Charger System and Use

Within the scope of the present invention is further a charging system, comprising an inventive superconductor magnet system as described above, and a charger magnet with a charger bore, for arranging the superconductor magnet system at least partially within the charger bore, in particular wherein the charger magnet comprises a low temperature superconductor magnet coil. With the charger system, the superconductor magnet system may be charged according to the inventive method described above. The low temperature superconductor magnet coil may be, in particular, of solenoid type and may, in particular, be wound from a NbTi or $Nb_3Sn$ superconductor wire. The low temperature superconductor magnet coil typically has a critical temperature below 30 K.

Within the scope of the present invention is further the use of an inventive charging system described above in an inventive method as described above.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

BRIEF DESCRIPTION OF THE DRAWINGS

The invention is shown through exemplary embodiments in the drawing.

DETAILED DESCRIPTION

Figure 1:
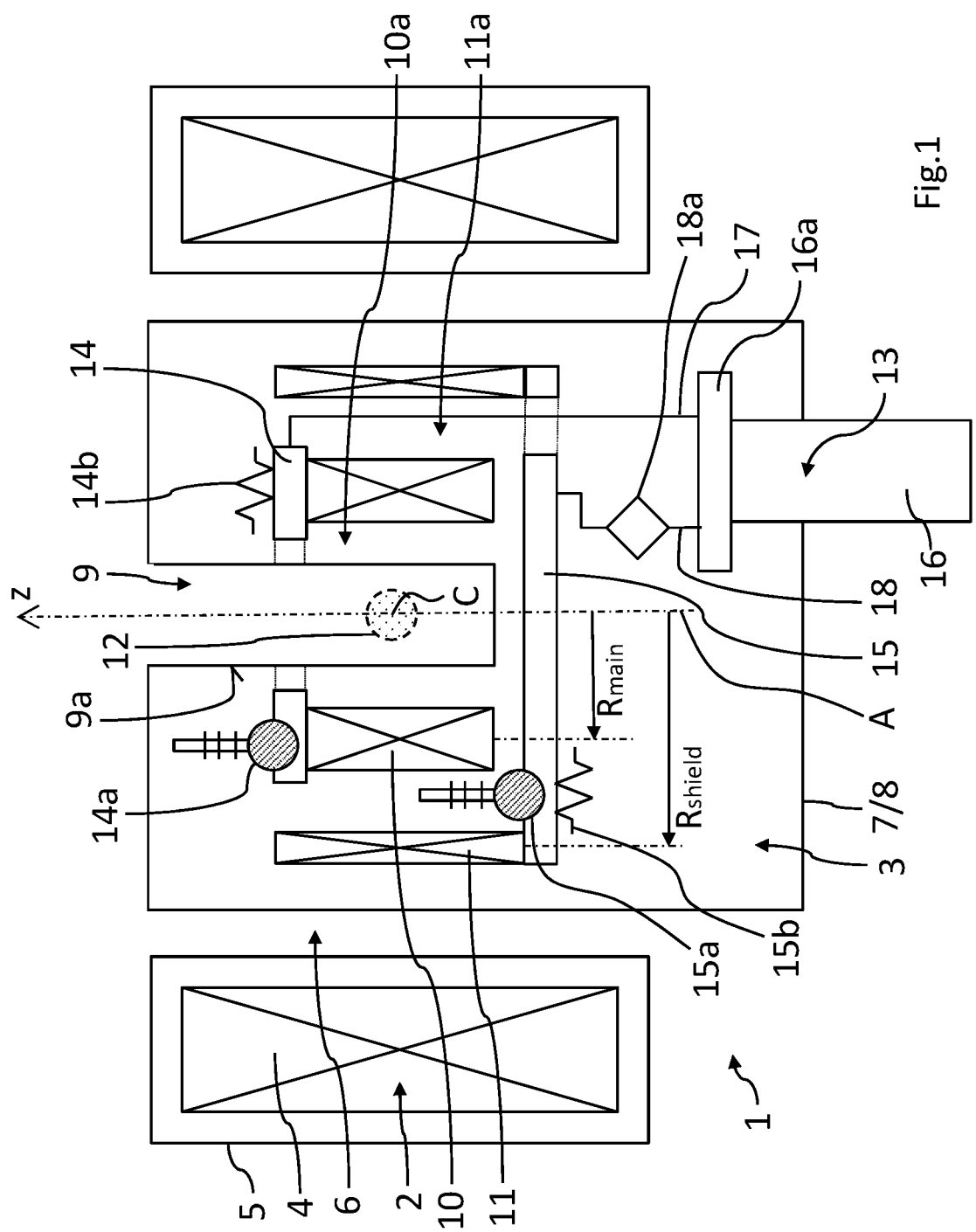
FIG. 1 shows a schematic longitudinal section of an inventive charger system, comprising a superconductor magnet system in a first embodiment with one normal cryocooler.

The invention is based on a hardware configuration of nested superconductor bulk rings/cylinders, which are charged by procedure which can be referred to as a "bipolar field-cooling". The hardware configuration has to provide that two subdivisions of the nested superconductor bulks are kept at substantially different yet stable temperatures over a relatively long period of time, of the order of several hours.

The first part of the inventive "bipolar field-cooling" cycle corresponds to a conventional field-cooling process. An outsert ("charger") magnet is ramped up to peak field while the nested superconductor bulks all are above their critical temperature (typically with the nested superconductor bulks above 100 K for REBCO). Then the inner bulk or bulks (i.e. the main superconductor bulk magnet, also referred to as "direct bulk" here) are cooled down to well below their critical temperature (typically with the direct bulk at 40-60

K for REBCO), and the charger magnet is ramped to zero current ("first charging step"). In contrast to the conventional field cooling procedure, which stops at zero amps in the charger magnet, the invention suggests to continue the ramp-down in current to negative currents, providing an inverse polarization of the magnetic field of the charger magnet. Only then, the outer bulk or bulks (i.e. the shield superconductor bulk magnet, also referred to as "shield bulk" here) is cooled below their critical temperature (typically with the direct bulk at 40-60 K for REBCO), and becomes superconducting. Ramping "up" the current in the charger magnet to zero ("second charging step") then leads to a trapped inverse polarization in the shield bulk. As the shield bulk has a much larger cross section (orthogonal to the magnetic axis) as compared to the direct bulk, the amplitude (or absolute final current strength in the shield bulk and corresponding magnetic field) of the second ("inverse") charging step can be much smaller than the amplitude (or absolute final current strength in the direct bulk and corresponding magnetic field) of the first ("direct") charging step in order to achieve comparable, opposing dipole moments, leading only to a loss in magnetic field that is small (e.g. 20% or less) as compared to the overall value. Note that the wall thickness of the shield bulk can accordingly be much smaller than the wall thickness of the direct bulk. In the example described below at FIG. 4, the direct charging step corresponds to 7.2 T, the inverse charging step corresponds to 1.2 T, and the net trapped magnetic flux is 6 T. This corresponds to a shield bulk diameter that is roughly twice the diameter of the direct bulk. Note that the magnetic flux is the magnetic flux density times area, and area scales as diameter squared.

EXPLANATION OF THE FIGURES

It should be noted that the figures are schematic in nature, and some features may be shown in an exaggerated or understated way, in order to show particular features of the invention more clearly.

FIG. 1 shows an inventive charging system 1, comprising a charger magnet 2 and an inventive superconductor magnet system 3, according to a first embodiment.

The charger magnet 2 comprises here a solenoid type magnet coil 4 wound from a low temperature superconductor wire, such as a NbTi wire. The charger magnet 2 is arranged in a charger cryostat 5, which is cooled by a cooling device not shown in detail. The charger magnet 2 may be loaded with a charger current $I_{charger}$ via electrical contacts and a current supply, also not shown in detail. When charged, the charger magnet 2 generates a charger magnetic flux density $B_{charger}$ within a charger bore 6. The charger magnetic flux density $B_{charger}$ is basically parallel to a common axis A at the of the charger bore 6.

The superconductor magnet system 3 comprises a cryostat system 7, a main superconductor bulk magnet 10 and a shield superconductor bulk magnet 11. In the embodiment shown, the cryostat system 7 comprises a common vacuum tank 8 encompassing both the main superconductor bulk magnet 10 and the shield superconductor bulk magnet 11. The cryostat system 7 or the common vacuum tank 8, respectively, has a room temperature bore 9 (compare wall 9a) arranged about the common axis A.

In general, a main or shield superconductor bulk magnet 10, 11 is of a closed ring shape, made of a single superconductor ring structure or of a plurality of ring-shaped superconductor sub-structures such as discs or coatings on a substrate (such as a sheet metal or a foil); the ring-shaped sub-structures are arranged coaxially and stacked axially and/or radially, and may be combined into a so-called "composite bulk" by structurally connecting the sub-structures. All these variants constitute superconductor bulk magnets, in accordance with the invention.

Structures or sub-structures for a superconductor bulk magnet may be grown from a melt; sub-structures to be combined into a "composite bulk" are typically made by coating a substrate. A superconductor bulk magnet, in accordance with the invention, allows a trapping of a magnetic field in its bore, wherein the superconductor bulk magnet in general does not possess any electric current supplies, but instead is designed for inductive charging only.

The shield superconductor bulk magnet 11 shown in FIG. 1 is of generally cylinder jacket type shape, with a shield bulk bore 11a. Radially within the shield bulk bore 11a, there is arranged the main superconductor bulk magnet 10, which is also of generally cylinder jacket type shape, with a main bulk bore 10a. Radially within the main bulk bore 10a, there is arranged the room temperature bore 9 of the cryostat system 7. The main superconductor bulk magnet 10 comprises a high temperature superconductor material with a critical temperature $T_{main}^{crit}$, and the shield superconductor bulk magnet comprises a high temperature superconductor material with a critical temperature $T_{shield}^{crit}$. It should be noted that the superconductor materials of the two bulk magnets 10, 11 are preferably chosen to be identical, but may be chosen to be different from one another, if desired.

The charger magnet 2 or its charger bore 6, respectively, further the shield superconductor bulk magnet 11 or its shield bulk bore 11a, respectively, further the main superconductor bulk magnet 10 or its main bulk bore 10a, and further the room temperature bore 9 of the charger system 7 are arranged coaxially with respect to the common axis A.

The common axis A defines a z-axis of the superconductor magnet system 3. In a charged state, the superconductor magnet system 2 generates a basically homogeneous magnetic flux density (often called $B_0$) basically in parallel to the z-axis in a sample volume 12 located about a magnetic center C within the room temperature bore 9. The magnetic flux density $B_0$ can be used e.g. for NMR measurements on a sample in the sample volume 12. The magnetic flux density $B_0$ results, above all, from a main persistent current $IP_{main}$ running circularly around the sample volume 12 (and around the z axis) in the main superconductor bulk magnet 10. At the same time, a shield persistent current $IP_{shield}$ runs circularly around the sample volume 12 (and around the z axis) in the shield superconductor bulk magnet 11, however with an opposite current direction ("inverse polarity"), what reduces the stray field of the superconductor magnet system 3, but also reduces somewhat the total magnetic flux density at the magnetic center C or the sample volume 12, respectively. The current strengths are preferably chosen such that $0.6 \leq |IP_{main}/IP_{shield}| * |R_{main}^2/R_{shield}^2| \leq 1.6$ applies, preferably with $|IP_{main}/IP_{shield}| * |R_{main}^2/R_{shield}^2| = 1$, with $R_{main}$ being the average radius of the main superconductor bulk magnet 10 and $R_{shield}$ being the average radius of the shield superconductor bulk magnet 11. In the example shown, about $R_{shield} = 2 * R_{main}$ applies. In case of constant wall thickness of the bulk magnets 10, 11, as shown here, the average radius is simply the middle between the inner radius and the outer radius; else an averaging has to be done about the circumference and/or along the length of the respective bulk magnet 10, 11.

In order to allow for the inventive charging procedure (an embodiment of which is described at FIG. 4 below) or the above described directions of persistent currents, respectively, the superconductor magnet system 3 is equipped with a cooling system 13. The cooling system 13 is designed to allow at least the following three states or temperature distributions of the temperature $T_{main}$ of the main superconductor magnet 10 and $T_{shield}$ of the shield superconductor bulk magnet 11:

State a) $T_{main} > T_{main}^{crit}$ and concurrently $T_{shield} > T_{shield}^{crit}$;
State b) $T_{main} < T_{main}^{crit}$ and concurrently $T_{shield} > T_{shield}^{crit}$; and
State c) $T_{main} < T_{main}^{crit}$ and concurrently $T_{shield} < T_{shield}^{crit}$.

The cooling system 13 comprises a main bulk thermal stage 14 attached to the main superconductor bulk magnet 10, and a shield bulk thermal stage 15 attached to the shield superconductor bulk magnet 11. Each thermal stage 14, 15 comprises its own temperature sensor 14a, 15a and its own electrical heater 14b, 15b. In the example shown, the thermal stages 14, 15 are arranged on opposite axial sides of the sample volume 12 with respect to the common axis A.

In the embodiment of FIG. 1, the cooling system 13 comprises a single normal cryocooler 16, which reaches into the cryostat system 7 or its vacuum tank 8, respectively, and in particular has its cold stage 16a inside the cryostat system 7. The normal cryocooler 16 or its cold stage 16a, respectively, is connected via a thermal connection 17 (e.g. a metal thermal conductor) to the main bulk thermal stage 14, and is connected via a thermal connection 18 (e.g. a metal thermal conductor) to the shield bulk thermal stage 15. The thermal connection 18 to the shield bulk thermal stage 18 here includes a shield thermal switch 18a. With the shield thermal switch 18a open, the normal cryocooler 16 provides, when operating, its cooling power basically only to the main bulk thermal stage 14, in particular in order to establish state b) mentioned above; further, a thermal short-circuit of the thermal stages 14, 15 via the cold stage 16a is prevented. With the shield thermal switch 18a closed, the normal cryocooler 16 provides, when operating, cooling power to both thermal stages 14, 15, in particular in order to establish state c) mentioned above. State a) mentioned above is typically established with the normal cryocooler 16 non-operating. Using the electrical heaters 14b, 15b, unwanted (remaining) cooling power input to the thermal stages 14, 15 may be opposed, in order to ensure a desired temperature above the critical temperature of the corresponding bulk magnet 10, 11.

The normal cryocooler 16 is here used during both the charging procedure of the superconductor magnet system 3 and during steady state use of the superconductor magnet system 3 after charging, and is permanently installed in the superconductor magnet system 3.

Figure 2:
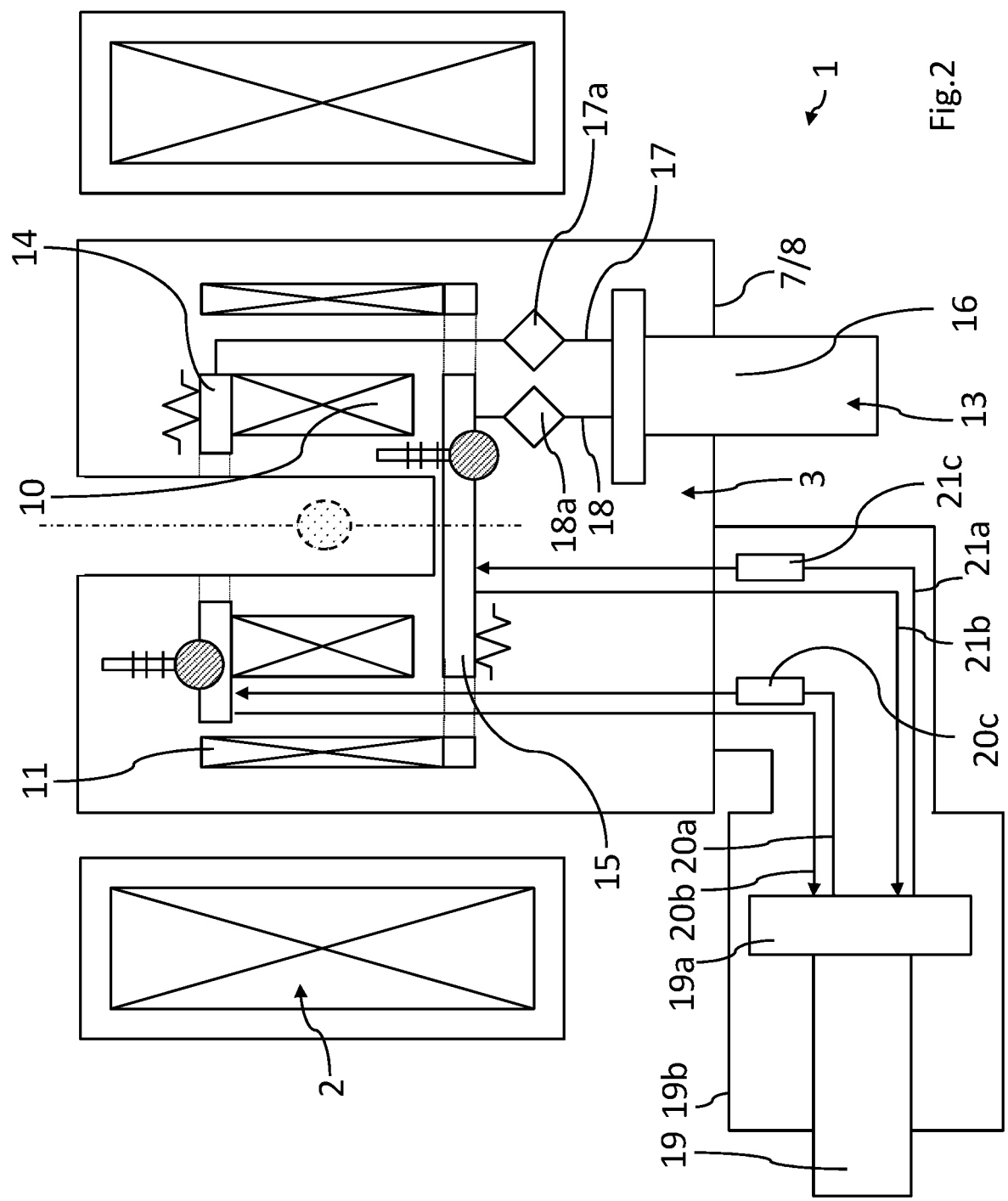
FIG. 2 shows a schematic longitudinal section of an inventive charger system, comprising a superconductor magnet system in a second embodiment with one normal cryocooler and an auxiliary cryocooler.

FIG. 2 shows another inventive charging system 1 with an inventive superconductor magnet system 3, similar to the charging system 1 shown in FIG. 1, so only the major differences are explained in detail.

In the embodiment of FIG. 2, the cooling system 13 comprises the permanently installed normal cryocooler 16, and further an auxiliary cryocooler 19 which is installed only for the charging procedure, but is removed during later steady state use.

The thermal connections 17, 18 from the normal cryocooler 16 to the thermal stages 14, here each comprise a thermal switch 17a, 18a, so the normal cryocooler 16 can be thermally decoupled from the thermal stages 14, 15 during the charging procedure, and also a thermal short-circuit between the thermal stages 14, 15 is prevented during charging. In particular, the normal cryocooler 16 can be non-operating during the charging procedure, which is useful if the normal cryocooler 16 cannot be operated as long as the stray field of the superconductor magnet system 3 is still high. The normal cryocooler 16 can be, for example, of pulse tube type.

The auxiliary cooler 19 provides for cooling power during the charging procedure, and may direct cooling power independently to the thermal stages 14, 15. The auxiliary cryocooler 19 here comprises its own auxiliary cryostat 19b, and provides a fluid coolant (e.g. helium) at its cold stage 19a.

In the embodiment shown, a forward line 20a for cold coolant leads to the main bulk thermal stage 14, and a return line 20b for warmed coolant leads from the main bulk thermal stage 14 back to the cold stage 19a. For controlling the cooling power at the main bulk thermal stage 14, a flow control device (adjustable valve) 20c is installed in one of the lines, here in the forward line 20a. Further, from the cold stage 19a of the auxiliary cryocooler 19 leads a forward line 21a for cold coolant to the shield bulk thermal stage 15, and a return line 21b for warmed coolant from the shield bulk thermal stage 15 back to the cold stage 19a. For controlling the cooling power at the shield bulk thermal stage 15, a flow control device (adjustable valve) 21c is installed in one of the lines, here in the forward line 21a.

For establishing state a) mentioned above, typically the auxiliary cryocooler 19 is operating at a very low flow of coolant, with the flow control devices 20c, 21c almost shut, since only little cooling power is required. For establishing state b), the auxiliary cryocooler 19 is operating at a medium flow of coolant, typically with the flow control device 20c being wide open, whereas the flow control device 21c is still almost shut. For establishing state c), the auxiliary cryocooler 19 is initially operating at high flow of coolant, and typically both flow control devices 20c, 21c are wide open. Once both thermal stages 14, 15 have reached their respective desired low temperature (operation temperature) below the critical temperature of the respective bulk magnet 10, 11, cooling power input is shifted to the then turned-on normal cryocooler 16 (with the thermal switches 17a, 18a closed), and the auxiliary cryocooler 19 is turned off. Then the auxiliary cryocooler 19 typically together with parts of the lines 20a, 20b, 21a, 21b outside the cryostat system 7 and together with the auxiliary cryostat 19b are removed.

Figure 3:
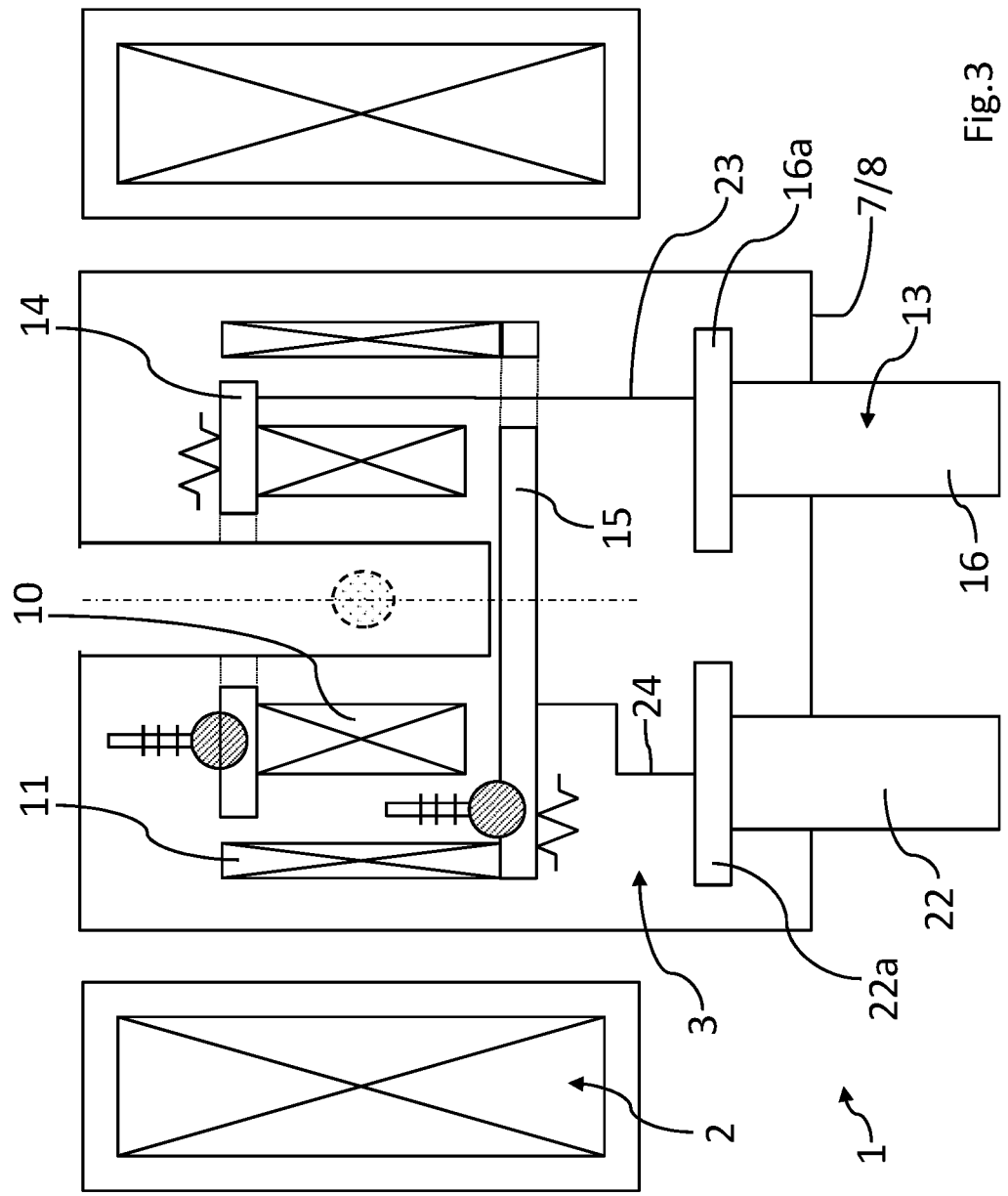
FIG. 3 shows a schematic longitudinal section of an inventive charger system, comprising a superconductor magnet system in a third embodiment with two normal cryocoolers.

FIG. 3 shows another inventive charging system 1 with a superconductor magnet system 3, similar to the charging system 1 shown in FIG. 1, so again only the major differences are explained in detail.

In the embodiment of FIG. 3, the cooling system 13 comprises two permanently installed normal cryocoolers 16, 22. Both normal cryocoolers 16, 22 reach with their respective cold stage 16a, 22a into the cryostat system 7 or its vacuum tank 8, respectively.

First normal cryocooler 16 has a thermal connection 23 from its cold stage 16a to the main bulk thermal stage 14. Second cryocooler 22 has a thermal connection 24 from its cold stage 22a to the shield bulk thermal stage 15. The two normal cryocoolers 16, 22 can be operated independently.

For establishing the state a) mentioned above, typically both normal cryocoolers 16, 22 are operating at reduced cooling power. Further, in order to establish state b) mentioned above, typically first normal cryocooler 16 is operating at increased cooling power, and second normal cryocooler 22 is still operating at reduced cooling power. Finally, in order to establish state c) mentioned above, typically both normal cryocoolers 16, 22 are operating at increased cooling power.

If desired, the thermal connection 24 from the cold stage 22a of second normal cryocooler 22 to the shield bulk thermal stage 15 may be equipped with a shield thermal switch (not shown), which is closed only for establishing state c).

Figure 4:
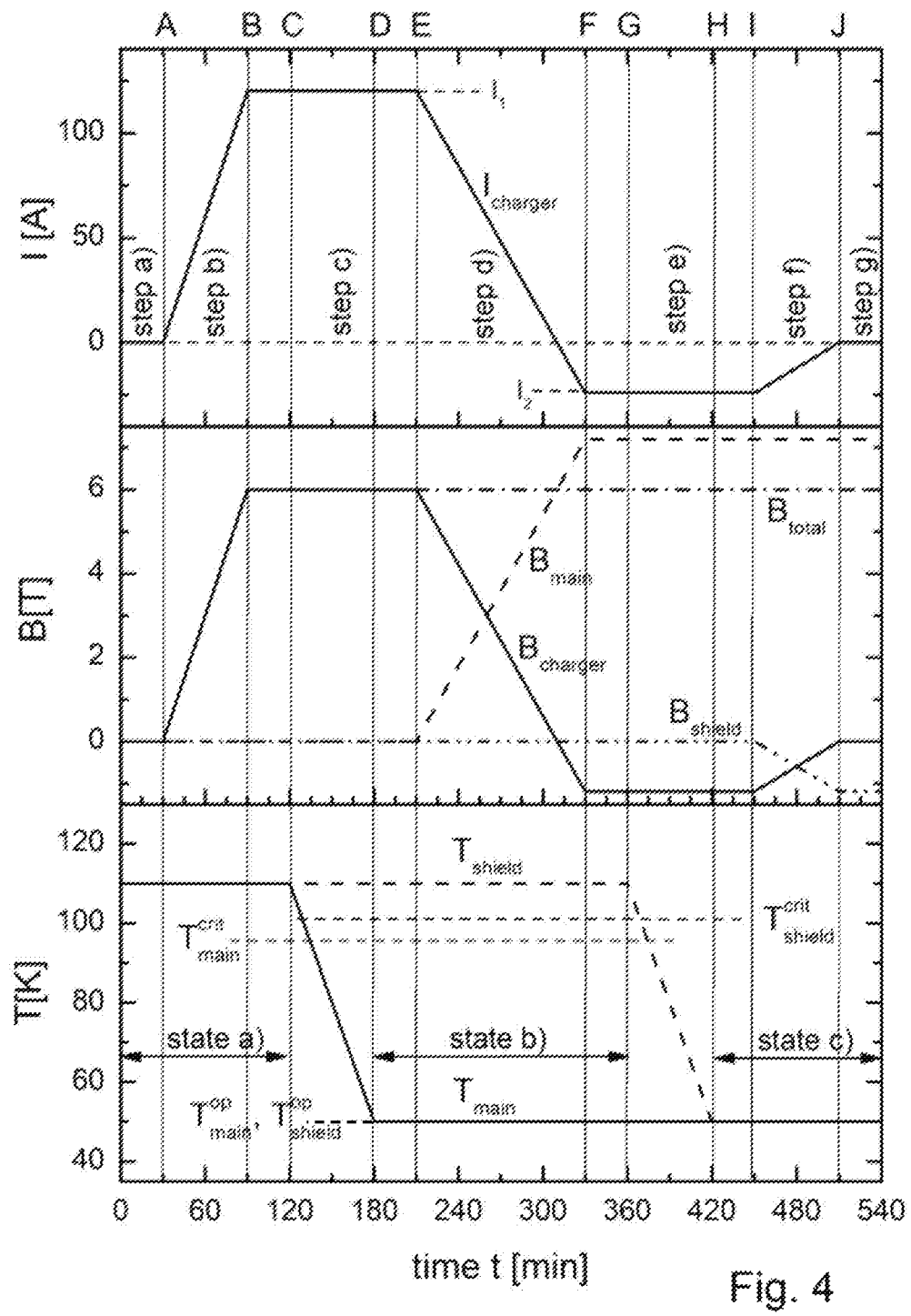
FIG. 4 shows a diagram illustrating bulk superconductor temperatures, charger current and magnetic flux densities during an exemplary variant of the inventive method for charging a superconductor magnet system.

FIG. 4 illustrates in a schematic diagram the temporal sequence of steps and states during the course of an exemplary variant of the inventive method for charging a superconductor magnet system, for example as illustrated in one of the FIG. 1, 2 or 3. On the axis to the right, the time t is plotted, in minutes. On the axis to the top, there is illustrated the applied current I (top third) in Ampere, generated magnetic flux densities B in Tesla (middle third) and applied temperatures T in Kelvin (bottom third).

The method begins in a state a), wherein the temperature $T_{main}$ of the main superconductor bulk magnet and the temperature $T_{shield}$ of the shield superconductor bulk magnet are above the respective critical temperatures $T_{main}^{crit}$ (here about 95 K) and $T_{shield}^{crit}$ (here about 100 K) at which the bulk magnets become superconducting. In the variant shown, $T_{main}$ and $T_{shield}$ are both at about 110 K during state a); this may be achieved by applying a low level of cooling power to the thermal stages. In this state a), as a first step a) taking place before time point A, the superconductor magnet system is arranged in the charger bore of the charger magnet, typically at the premises of the manufacturer of the superconductor magnet system.

Still in state a), there is a step b), starting at time point A and taking until point of time B, wherein a charger current $I_{charger}$ is applied and increased from zero to a first (positive) current $I_1$, here of about 120 A. This causes an increase of a magnetic flux density $B_{charger}$ generated by the charger magnet, here to about 6 T. Note that all indications of magnet flux relate to the only relevant component in z direction (in parallel to the common axis) and to the magnetic center (and its homogeneous vicinity, i.e. the sample volume) of the superconductor magnet system, for simplicity. Since both bulk magnets are in the non-superconducting state, any currents induced therein during step b) decay quickly, so no noticeable magnetic flux densities $B_{main}$ from the main superconductor bulk magnet or $B_{shield}$ from the shield superconductor bulk magnet are noted in the diagram. However, after step b), a short relaxation period from time point B to time point C is awaited.

Then in a step c), between time points C and D, the temperature $T_{main}$ of the main superconductor bulk magnet is lowered to an operation temperature $T_{main}^{op}$ of the main superconductor bulk magnet, with $T_{main}^{op} < T_{main}^{crit}$; note that $T_{main}^{op}$ corresponds to a "maximum" for $T_{main}$ after step c). In the example shown, about $T_{main}^{op}=50$ K and about $T_{main}^{op}=0.53*T_{main}^{crit}$ applies. Accordingly, the main superconductor bulk magnet becomes superconducting. After step c) is finished, the superconductor bulk magnet has reached state b), wherein $T_{main}=T_{main}^{op}$ with $T_{main}^{op}<T_{main}^{crit}$, but still with $T_{shield}>T_{shield}^{crit}$. Again, after step c), a short relaxation time is awaited between time points D and E.

In state b), in a subsequent step d), between time steps E and F, the charger current $I_{charger}$ is lowered from the first (positive) current $I_1$ to a second (negative) current $I_2$. This causes a corresponding decrease of the magnetic flux density $B_{charger}$ generated by the charger magnet, here from about 6 T to about −1.2 T. Concurrently, a circular (positive) current $I_{main}$ (not shown in the diagram) is induced in the main superconductor bulk magnet, which is in a superconducting state. This induced current $I_{main}$ comes along with a corresponding (proportional) magnetic flux density $B_{main}$ originating from the main superconductor bulk magnet, which increases from zero to here about 7.2 T. Together, the magnetic flux densities $B_{charger}$ and $B_{main}$ result during and at the end of step d) in a total magnetic flux density $B_{total}$, which is constantly at 6 T, corresponding to the magnetic flux density of $B_{charger}$ at the end of step b) before, which is in accordance to the principle that the (total) magnetic flux density inside of a superconducting magnet, here inside of the main superconductor bulk magnet, stays constant. Since the shield superconductor bulk magnet is still non-superconducting, any current induced there decays quickly and is not relevant. Subsequent to step d), between time points F and G, a short relaxation time is again awaited.

Next step e), between time points G and H, comprises lowering the temperature $T_{shield}$ of the shield superconductor bulk magnet from here about 110 K to an operation temperature $T_{shield}^{op}$ of the shield superconductor bulk magnet of here about 50 K; note that $T_{shield}^{op}$ corresponds to a "maximum" for $T_{shield}$ after step e). So then, in the example shown, $T_{shield}=T_{shield}^{op}$ with $T_{shield}^{op}<T_{shield}^{crit}$, here with about $T_{shield}^{op}=0.5*T_{shield}^{crit}$, and the shield superconductor bulk magnet becomes superconducting. At the end of step e), both $T_{main}=T_{main}^{op}$ with $T_{main}^{op}<T_{main}^{crit}$ and $T_{shield}=T_{shield}^{op}$ with $T_{shield}^{op}<T_{shield}^{crit}$ applies, so state c) has been reached.

In the example shown, $T_{main}^{op}$ and $T_{shield}^{op}$ are equal at about 50 K, which can be established and maintained relatively easily in a common vacuum tank of a cryostat system and using a common (normal) cryocooler. However, it is also possible to choose $T_{main}^{op}$ and $T_{shield}^{op}$ at different temperatures, in particular using two separate (normal) cryocoolers, if desired. It should also be mentioned here that although shown as being practically constant in FIG. 4 after having been lowered in steps c) and e), $T_{main}$ and $T_{shield}$ may fluctuate somewhat in accordance with the invention, provided that $T_{main}$ stays at or below $T_{main}^{op}$ from state b) on (i.e. after step c), respectively), and $T_{shield}$ stays at or below $T_{shield}^{op}$ from state c) on (i.e. after step e), respectively), and any induced currents in the bulk magnets can be superconductively carried completely, i.e. without reaching the respective critical current carrying capacity of the bulk magnet.

In the variant shown, again a short relaxation time is awaited between time points H and I.

Then, in the state c), in step f) between time points I and J, the charger current $I_{charger}$ is increased from (negative) second current $I_2$ to zero. This comes along with a corresponding increase of the magnetic flux density $B_{charger}$ generated by the charger magnet from here −1.2 T to zero. This induces a (negative) current $I_{shield}$ (not shown in the diagram) within the shield superconductor bulk magnet, which comes along with a corresponding (proportional) magnetic flux density $B_{shield}$ caused by the shield superconductor bulk magnet, here of about −1.2 T at the end of step f). In other words, the magnetic flux inside the shield superconductor bulk magnet formerly generated by the charger magnet is trapped by the shield superconductor bulk magnet inside of it, corresponding to a constant flux inside the superconducting shield superconductor bulk magnet. The total magnetic flux density $B_{total}$ during and after step f), i.e. the sum of $B_{main}$, $B_{shield}$ and $B_{charger}$, remains constant at 6 T, corresponding to a constant magnetic flux inside the superconducting main superconductor bulk magnet.

At the end of step f) at time point J, the steady state of the superconductor magnet system has been reached. In a subsequent step g) taking place after time point J, the superconductor magnet system may now be removed from the charger magnet and transported to a site of application. As long as $T_{main}$ and $T_{shield}$ are kept at or below $T_{main}^{op}$ and $T_{shield}^{op}$, hence well below $T_{main}^{crit}$ and $T_{shield}^{crit}$, respectively, i.e. as long as state c) is maintained, the magnetic flux density $B_{total}=B_0$, with here $B_0=6$ T, stays available and may be used for measurements, in particular NMR measurements of samples in the sample volume.

The current $I_{main}$ of the main superconductor bulk magnet stays at a (positive) main persistent current $IP_{main}$ (not shown in detail in the diagram), which is proportional to the final $B_{main}$ value of here about 7.2 T, and the current $I_{shield}$ stays at a (negative) shield persistent current $IP_{shield}$ (also not shown in the diagram), which is proportional to the final $B_{shield}$ value of here about −1.2 T. It should be noted that typically, the absolute values of $IP_{main}$ and $IP_{shield}$ are of the order of tens to hundreds of kA (e.g. $IP_{main}=360$ kA and $IP_{shield}=-60$ kA), since the charger magnet coil in general has thousands of windings, whereas the main and shield superconductor bulk magnet typically have only one winding each. In the example shown, the absolute value of the ratio of the final $B_{main}$ and $B_{shield}$ values is about |7.2 T/1.2 T|=6, so about $|IP_{main}/IP_{shield}|=6$ applies here. With a typical ratio of $R_{shield}=2*R_{main}$, this results in a ratio $|IP_{main}/IP_{shield}|*|R_{main}^2/R_{shield}^2|$ of about 1.5; note that values between 0.6 and 1.6 are preferred for this ratio, in order to have a good active shielding effect of the shield superconductor bulk magnet for the charged superconductor magnet system.

In the variant illustrated in FIG. 4, the inventive charging procedure takes about 8 hours. However, the inventive procedure may in other variants take a shorter time, such as 3 hours or less, or may take a longer time, such as 24 hours or more, depending on the thermal coupling between the main and shield superconductor bulk magnets and the cooling system, which counteracts a warming e.g. caused by hysteresis effects during charging.

In summary, an embodiment of the invention, as described above, relates to a method for charging a superconductor magnet system (3) comprising coaxially a main superconductor bulk magnet (10) and a shield superconductor bulk magnet (11), the method comprising the following steps:

step a) arranging the superconductor magnet system (3) at least partially within a charger bore (6) of a charger magnet (2), step b) with $T_{main}>T_{main}^{crit}$ and $T_{shield}>T_{shield}^{crit}$, applying an electrical current $I_{charger}$ to the charger magnet (2) and increasing $I_{charger}$ to a first current $I_1>0$, step c) lowering $T_{main}$ to or below an operation temperature $T_{main}^{op}$ of the main superconductor bulk magnet (10), with $T_{main}^{op}<T_{main}^{crit}$, while keeping $T_{shield}>T_{shield}^{crit}$;

step d) lowering $I_{charger}$ to a second current $I_2<0$, wherein a main persistent current $IP_{main}$ is induced in the main superconductor bulk magnet (10);

step e) lowering $T_{shield}$ to or below an operation temperature $T_{shield}^{op}$ of the shield superconductor bulk magnet (11), with $T_{shield}^{op}<T_{shield}^{crit}$;

step f) increasing $I_{charger}$ to zero, wherein a shield persistent current $IP_{shield}$ is induced in the shield superconductor bulk magnet (11);

step g) removing the superconductor magnet system (3) from the charger bore (6) of the charger magnet (2), and keeping $T_{main}$ at or below $T_{main}^{op}$ with $T_{main}^{op}<T_{main}^{crit}$ as well as $T_{shield}$ at or below $T_{shield}^{op}$ with $T_{shield}^{op}<T_{shield}^{crit}$;

with $T_{main}$: temperature of the main superconductor bulk magnet (10);

$T_{main}^{crit}$: critical temperature of the main superconductor bulk magnet (10);

$T_{shield}$: temperature of the shield superconductor bulk magnet (11); and $T_{shield}^{crit}$: critical temperature of the shield superconductor bulk magnet (11). The invention allows the stray field of the superconductor magnet system to be reduced, so that less weight and space are required for shielding purposes than were required conventionally.

LIST OF REFERENCE SIGNS 1 charging system
2 charger magnet
3 superconductor magnet system
4 magnet coil (charger magnet)
5 charger cryostat
6 charger bore
7 cryostat system
8 vacuum tank
9 room temperature bore
9a wall of the room temperature bore
10 main superconductor bulk magnet
10a main bulk bore
11 shield superconductor bulk magnet
11a shield bulk bore
12 sample volume
13 cooling system
14 main bulk thermal stage
14a temperature sensor (main bulk thermal stage)
14b electric heater (main bulk thermal stage)
15 shield bulk thermal stage
15a temperature sensor (shield bulk thermal stage)
15b electrical heater (shield bulk thermal stage)
16 (first) normal cryocooler
16a cold stage
17 thermal connection
17a thermal switch
18 thermal connection
18a (shield) thermal switch
19 auxiliary cryocooler
19a cold stage
20a forward line
20b return line
20c flow control device
21a forward line
21b return line
21c flow control device
22 (second) normal cryocooler
22a cold stage
23 thermal connection
24 thermal connection
A common axis
$B_{charger}$ magnetic flux density generated by charger magnet
$B_{main}$ magnetic flux density generated by main superconductor bulk magnet
$B_{shield}$ magnetic flux density generated by shield superconductor bulk magnet
$B_{total}$ total magnetic flux density generated by charger magnet, main superconductor bulk magnet and shield superconductor bulk magnet
C magnetic center
$I_{charger}$ current of charger magnet
$IP_{main}$ persistent current of main superconductor bulk magnet
$IP_{shield}$ persistent current of shield superconductor bulk magnet
$I_{main}$ induced current of main superconductor bulk magnet
$I_{shield}$ induced current of shield superconductor bulk magnet $I_1$ first current (charger magnet)
$I_2$ second current (charger magnet)
$R_{main}$ average radius of main superconductor bulk magnet
$R_{shield}$ average radius of shield superconductor bulk magnet
$T_{main}$ temperature of main superconductor bulk magnet
$T_{main}^{crit}$ critical temperature of main superconductor bulk magnet
$T_{main}^{op}$ operation temperature of main superconductor bulk magnet
$T_{shield}$ temperature of shield superconductor bulk magnet
$T_{shield}^{crit}$ critical temperature of shield superconductor bulk magnet
$T_{shield}^{op}$ operation temperature of shield superconductor bulk magnet

What is claimed is:

1. Method for charging a superconductor magnet system, the superconductor magnet system comprising
    a main superconductor bulk magnet defining a main bulk bore,
    a shield superconductor bulk magnet defining a shield bulk bore, and
    a cryostat system having a room temperature bore,
        wherein the cryostat system contains the main superconductor bulk magnet and the shield superconductor bulk magnet,
        wherein the shield superconductor bulk magnet radially surrounds the main superconductor bulk magnet such that the main bulk bore lies radially within the shield bulk bore, and
        wherein the main superconductor bulk magnet and the shield superconductor bulk magnet are arranged coaxially with the room temperature bore such that the room temperature bore lies radially within the main bulk bore,
    the method comprising:
    step a) arranging the superconductor magnet system at least partially within a charger bore of a charger magnet;
    step b) with $T_{main}>T_{main}^{crit}$ and $T_{shield}>T_{shield}^{crit}$ applying an electrical current $I_{charger}$ to the charger magnet and increasing $I_{charger}$ to a first current $I_1>0$,
    step c) lowering $T_{main}$ to or below an operation temperature $T_{main}^{op}$ of the main superconductor bulk magnet, with $T_{main}^{op}<T_{main}^{crit}$, while keeping $T_{shield}>T_{shield}^{crit}$;
    step d) lowering $I_{charger}$ to a second current $I_2<0$, wherein a main persistent current $IP_{main}$ is induced in the main superconductor bulk magnet, which stays below a critical current of the main superconductor bulk magnet at $T_{main}$, with $T_{main} \leq T_{main}^{op}$;
    step e) lowering $T_{shield}$ to or below an operation temperature $T_{shield}^{op}$ of the shield superconductor bulk magnet, with $T_{shield}^{op}<T_{shield}^{crit}$;
    step f) increasing $I_{charger}$ to zero, wherein a shield persistent current $IP_{shield}$ is induced in the shield superconductor bulk magnet, which stays below a critical current of the shield superconductor bulk magnet at $T_{shield}$, with $T_{shield} \leq T_{shield}^{op}$;
    step g) removing the superconductor magnet system from the charger bore of the charger magnet, and keeping $T_{main}$ at or below $T_{main}^{op}$ with $T_{main}^{op}<T_{main}^{crit}$ as well as $T_{shield}$ at or below $T_{shield}^{op}$, with $T_{shield}^{op}<T_{shield}^{crit}$,
    with $T_{main}$: temperature of the main superconductor bulk magnet;
    $T_{main}^{crit}$: critical temperature of the main superconductor bulk magnet;
    $T_{shield}$: temperature of the shield superconductor bulk magnet; and
    $T_{shield}^{crit}$: critical temperature of the shield superconductor bulk magnet,
    wherein the temperatures $T_{main}$, $T_{shield}$ are set to different values during the steps c) and d), and
    wherein the main superconductor bulk magnet and the shield superconductor bulk magnet are, at least temporarily, substantially thermally decoupled during the charging method.

2. Method according to claim 1, wherein the charger bore is arranged coaxially with the room temperature bore of the cryostat system in the step a).

3. Method according to claim 1, wherein $|I_2/I_1| \leq 0.33$.

4. Method according to claim 1, wherein $0.7 \leq |I_1/I_2|*|R_{main}^2/R_{shield}^2| \leq 1.4$,
    with $R_{main}$: average radius of the main superconductor bulk magnet; and
    $R_{shield}$: average radius of the shield superconductor bulk magnet.

5. Method according to claim 1, wherein $T_{main}^{op} \leq 0.75*T_{main}^{crit}$ and $T_{shield}^{op} \leq 0.75*T_{shield}^{crit}$.

6. Method according to claim 1, wherein
    the cryostat system comprises a normal cryocooler and thermal connections of the normal cryocooler to a main bulk thermal stage connected to the main superconductor bulk magnet and to a shield bulk thermal stage connected to the shield superconductor bulk magnet,
    during the step c) and the step d), a shield thermal switch in the thermal connection to the shield bulk thermal stage is kept open, and
    during the step e) and after the step e), the shield thermal switch is kept closed.

7. Method according to claim 1, wherein
    at least during the steps c) through f), the cryostat system is equipped with an auxiliary cryocooler,
    during the steps c) through f), cooling power of the auxiliary cryocooler is directed to a main bulk thermal stage connected to the main superconductor bulk magnet,
    during the steps e) and f), cooling power of the auxiliary cryocooler is directed to a shield bulk thermal stage connected to the shield superconductor bulk magnet,
    after the step f), the auxiliary cryocooler is removed from the cryostat system,
    and the cryostat system comprises a normal cryocooler and thermal connections of the normal cryocooler to the main bulk thermal stage and to the shield bulk thermal stage,
    and after the step f), the normal cryocooler provides cooling power to the main bulk thermal stage and to the shield bulk thermal stage.

8. Method according to claim 7, wherein the normal cryocooler provides cooling power to the main bulk thermal stage and to the shield bulk thermal stage only after the step f).

9. Method according to claim 7, wherein
    the thermal connection between the normal cryocooler and the main bulk thermal stage and/or the thermal connection between the normal cryocooler and the shield bulk thermal stage include/includes a weak thermal link or a thermal switch, and
    the weak thermal link or the thermal switch slows down or blocks heat conduction between the normal cryocooler and the main bulk thermal stage and/or between the normal cryocooler and the shield bulk thermal stage during at least some of the step c), the step d), the step e) and/or the step f).

10. Method according to claim 1, wherein
the cryostat system includes two normal cryocoolers, with a first of the normal cryocoolers having a thermal connection to a main bulk thermal stage connected to the main superconductor bulk magnet, and a second of the normal cryocoolers having a thermal connection to a shield bulk thermal stage connected to the shield superconductor bulk magnet, and
the first normal cryocooler provides cooling power to the main bulk thermal stage beginning with the step c), and the second normal cryocooler provides cooling power to the shield bulk thermal stage beginning with the step e).

* * * * *